(12) United States Patent
Shields et al.

(10) Patent No.: US 10,070,220 B2
(45) Date of Patent: Sep. 4, 2018

(54) METHOD FOR EQUALIZATION OF MICROPHONE SENSITIVITIES

(71) Applicant: Dialog Semiconductor (UK) Limited, London (GB)

(72) Inventors: Paul Shields, Dunblane (GB); Ashley Hughes, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/928,608

(22) Filed: Oct. 30, 2015

(65) Prior Publication Data
US 2017/0127180 A1   May 4, 2017

(51) Int. Cl.
- *H04R 3/00* (2006.01)
- *H04R 3/04* (2006.01)
- *H03G 3/30* (2006.01)

(52) U.S. Cl.
CPC ............ *H04R 3/04* (2013.01); *H03G 3/3005* (2013.01); *H04R 3/005* (2013.01)

(58) Field of Classification Search
CPC ........ H04R 3/04; H04R 3/005; H03G 3/3005; H03G 5/025; H03G 5/165
USPC .................................... 381/91, 92, 103, 303
See application file for complete search history.

(56) References Cited

U.S. PATENT DOCUMENTS

| 7,117,145 B1 | 10/2006 | Venkatesh et al. |
| 8,243,952 B2 | 8/2012 | Thormundsson et al. |
| 8,321,214 B2 | 11/2012 | Chan et al. |
| 8,611,556 B2 * | 12/2013 | Makinen ................ H04R 3/005 367/13 |
| 8,824,692 B2 | 9/2014 | Sheerin et al. |

(Continued)

FOREIGN PATENT DOCUMENTS

| JP | 1989082887 | * | 1/1989 |
| JP | 19899082887 | * | 1/1989 |
| WO | WO 2011/002823 | | 1/2011 |

OTHER PUBLICATIONS

Ignacio, "Estimation of the magnitude squared coherence spectrum based on reduced-rank canonical coordinates", 2007.*
Alice, "How to perform a logistic regression in R", Sep. 2015.*
Ignacio, "Estimation of the magnitude squared coherence spectrum based on reduced-rank canonical coordinates".*

(Continued)

*Primary Examiner* — William A Jerez Lora
(74) *Attorney, Agent, or Firm* — Saile Ackerman LLC; Stephen B. Ackerman

(57) ABSTRACT

The proposed invention implements real-time sensitivity estimation, using a microphone path, and variable gain. When a multi-microphone system is configured to perform in its target use case, and the microphone gain is estimated, and the system output is corrected for performance degradation, sensitivity compensation is performed. A classification system is implemented to enable or disable subsequent gain estimation, and hence power consumption required when enabled or disabled, on a frame-by-frame basis. An acoustic environment is used to trigger a classification system, with electrical power consumption analysis performed to detect audio segments. The approach to the microphone sensitivity mismatch problem is to estimate the mismatch at runtime and provide gain compensation, and provide runtime compensation for the difference in sensitivity to sound pressure level between transducer elements in an array of 2 or more microphones.

18 Claims, 7 Drawing Sheets

(56) References Cited

U.S. PATENT DOCUMENTS

| | | | |
|---|---|---|---|
| 2004/0030544 A1* | 2/2004 | Ramabadran | G10L 25/78 704/205 |
| 2005/0207585 A1 | 9/2005 | Christoph | |
| 2010/0046770 A1* | 2/2010 | Chan | H04R 3/005 381/92 |
| 2011/0051953 A1* | 3/2011 | Makinen | H04R 1/406 381/92 |
| 2011/0305345 A1* | 12/2011 | Bouchard | G10L 21/0208 381/23.1 |
| 2012/0140946 A1* | 6/2012 | Yen | H04R 1/1083 381/92 |
| 2013/0170666 A1* | 7/2013 | Ng | H04R 29/006 381/92 |
| 2013/0229310 A1* | 9/2013 | Parks | G01S 5/0284 342/417 |
| 2015/0010170 A1 | 1/2015 | Lindahl et al. | |
| 2015/0030165 A1 | 1/2015 | Risberg et al. | |

OTHER PUBLICATIONS

Alice, "How to perform a logistic regression in R".*

"Beamformer Sensitivity to Microphone Manufacturing Tolerances," by Ivan Tashev, Microsoft Research, One Microsoft Way, Redmond, WA, 98052, USA, Sep. 2005, 4 pgs.

"Gain Self-Calibration Procedure for Microphone Arrays," by Ivan Tashev, Microsoft Research, One Microsoft Way, Redmond, WA, 98052, USA, Jun. 30, 2004, 4 pgs.

German Office Action, File No. 10 2015 221 764.7, Applicant: Dialog Semiconductor (UK) Limited, dated Jan. 13, 2017, 9 pgs., and English language translation, 8 pgs.

* cited by examiner

METHOD FOR EQUALIZATION OF MICROPHONE SENSITIVITIES

BACKGROUND OF THE INVENTION

Field of the Invention

This invention relates generally to the field of acoustic digital signal processing and the use of multi-microphone signal processing algorithms.

Description of Related Art

The use of multi-microphone signal processing algorithms to improve speech quality is pervasive in portable audio products such as mobile phones and tablets.

Beamforming algorithms utilize two or more microphones to selectively enhance a wanted signal, such as speech, and suppress unwanted noise. FIG. 1 shows an example of a possible implementation of such a system on a Digital Signal Processor (DSP) 100. This example consists of a set of analog microphones connected to Analog to Digital Converter (ADC) 110 of a DSP chip, which routes the digital signals to beamforming algorithm 120. This algorithm produces processed output, which can be routed for further processing within the DSP or output, digitally or as an analog signal via a Digital to Analog Converter (DAC). An implementation in silicon is also possible, and note that digital MEMs microphones have the ADC integrated within the device, and therefore don't require a separate ADC.

Even a simple delay and sum beamforming algorithm is sensitive to microphone channel mismatch. In some cases, a microphone sensitivity mismatch of 6 dB may result in a reduction in wanted signal enhancement of approximately 18 dB. This is a realistic worst-case measure as typical microphone manufacturing tolerances may be in the range +−3 dB.

There are a number of approaches to the microphone sensitivity mismatch problem. One is to specify the microphones have a very tight manufacturing tolerance. Another is to require production line trimming or matching of the microphone tolerance, which has the added disadvantage that sensitivity may drift over time. These two approaches significantly increase production costs, rendering their use impractical or commercially uncompetitive in most instances.

SUMMARY OF THE INVENTION

An object of this disclosure is binary classification, with Magnitude Squared Coherence used as the classifier, and a system of evaluation of that information, to make a decision on the extent of whether received signals may be considered diffuse, and calibration enabled or disabled when the signal is acceptable for using Root Mean Square calculations, to determine sensor and/or channel gain miss-matching between microphones.

Further, another object of this disclosure is to estimate the microphone real-time sensitivity mismatch and provide gain compensation at runtime.

Still further, another object of this disclosure is to provide gain compensation for an array of 2 or more microphones.

To accomplish at least one of these objects, a method for microphone runtime compensation is implemented, providing a Signal Classifier, to receive inputs from N microphones, and using Magnitude Squared Coherence in the Signal Classifier to separate coherent signal from a diffuse signal. A Signal Mismatch Estimator is provided, to calculate the microphone mismatch, with a Kalman Filter. Gain compensation is applied, in the Signal Mismatch Estimator, resulting in a scaled output.

In various embodiments, the real-time sensitivity estimation and variable gain function may be achieved using a single cycle Multiplier-Accumulator (MAC) Digital Signal Processor (DSP) in approximately 5 Megahertz (MCPS) for 4×16 KHz audio channels/microphone inputs.

In other embodiments, the real-time sensitivity estimation and variable gain function may be implemented for other areas of beamforming, including acoustically, at radio frequency, and for underwater sonar.

DETAILED DESCRIPTION OF THE INVENTION

The present disclosure addresses the problems caused by the variability in sound pressure level to electrical level conversion, inherent within microphone transducers and acoustic designs. This sensitivity mismatch is typically caused by the variation due to manufacturing tolerance during mass production.

The present disclosure implements real-time sensitivity estimation, using a microphone path and variable gain. When a multi-microphone system is configured to perform in its target use case, and the microphone gain is estimated and the system output is corrected for performance degradation, sensitivity compensation is achieved. A classification system is implemented to enable or disable subsequent gain estimation, and hence power consumption required when enabled or disabled, on a frame-by-frame basis. An acoustic environment is used to trigger a classification system, with electrical power consumption analysis performed to detect audio segments.

The approach to the microphone sensitivity mismatch problem implemented is to estimate the mismatch at runtime and provide gain compensation. The proposed solution provides runtime compensation for the difference in sensitivity to sound pressure level between transducer elements in an array of 2 or more microphones.

The objective is to calculate and compensate for the microphone sensitivity mismatch using only the available audio sound field, and not requiring the use of any additional audio stimulus to produce the N−1 unique gain compensations to be applied to N−1 microphone inputs, where N is the number of microphones and N>=2. The N−1 gains compensate for each microphone's sensitivity mismatch relative to a reference transducer, selected to be the primary/master from the microphone array.

Figure 1:
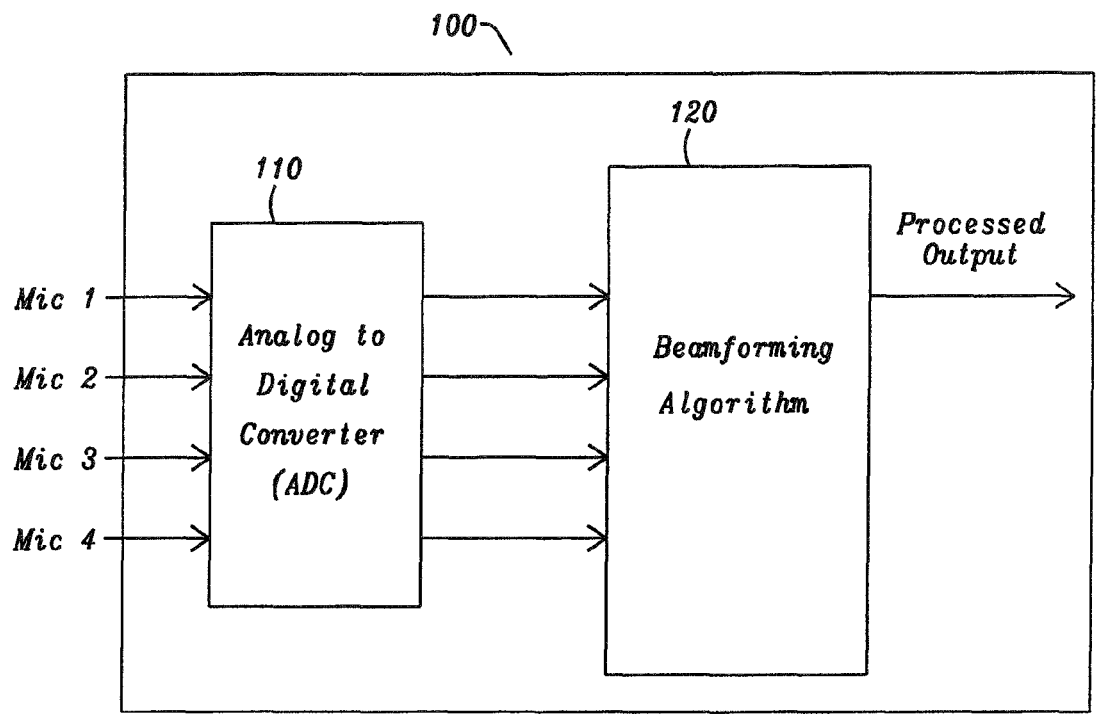
FIG. 1 shows an example of a Beamforming System implementation on a Digital Signal Processor (DSP).
Figure 2:
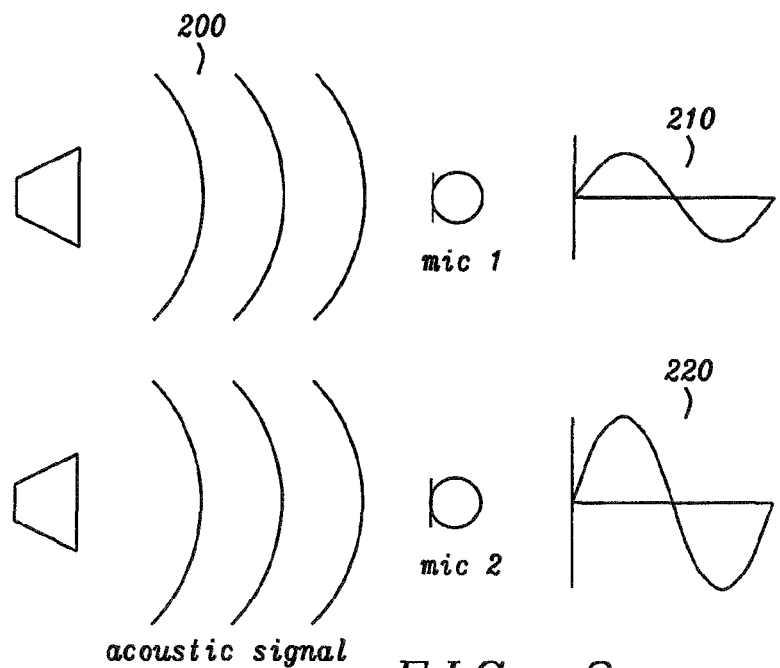
FIG. 2 illustrates variation in microphone sensitivities between individual transducers, for a given acoustic signal incident to a microphone.

FIG. 2 illustrates variation in microphone sensitivities 200, between individual transducers for a given acoustic signal incident to a microphone. When an acoustic signal of a given sound pressure level (SPL) is incident to microphone 1 and microphone 2, the energy of the electrical signal output by transducer 210 and transducer 220 is a function of sensitivity, and varies between individual transducers.

Ideally, all microphones should output similar electrical signal levels for a given SPL at their input; however, this is not the case, and this causes performance degradation for audio processing algorithms such as beamforming. The purpose of the proposed solution is to calculate a set of gains for a microphone array such that the output is a scaled version of the input signals, mirroring the performance of a matched set of microphones. The scaling calculated for each microphone is the gain required to equalize the root mean square (RMS) level of that signal to that of a reference signal, which is the output of a chosen microphone in the array. It is assumed that the sensitivity difference does not vary over frequency, and therefore only a scalar gain is required for each microphone channel.

Simple equalization of the RMS levels is not sufficient, as there may be a coherent source in the vicinity of the microphone array. The differing path lengths from the source to each individual microphone results in a level difference according to the inverse square law, where the levels are inversely proportional to the square of the distance from the coherent source, and which would be incorrectly interpreted as microphone sensitivity mismatch.

If the sound field is diffuse and the acoustic energy input to each transducer is the same value, the RMS level differences are due to sensitivity mismatch. In the present disclosure, the input signals are examined and an attempt is made to determine if the noise field is diffuse. Once determined to be diffuse, then it is assumed to be safe to estimate the microphone sensitivity mismatch. The disclosure has two main signal processing components, a Signal Classifier and a Signal Mismatch Estimator/Compensator.

Figure 3:
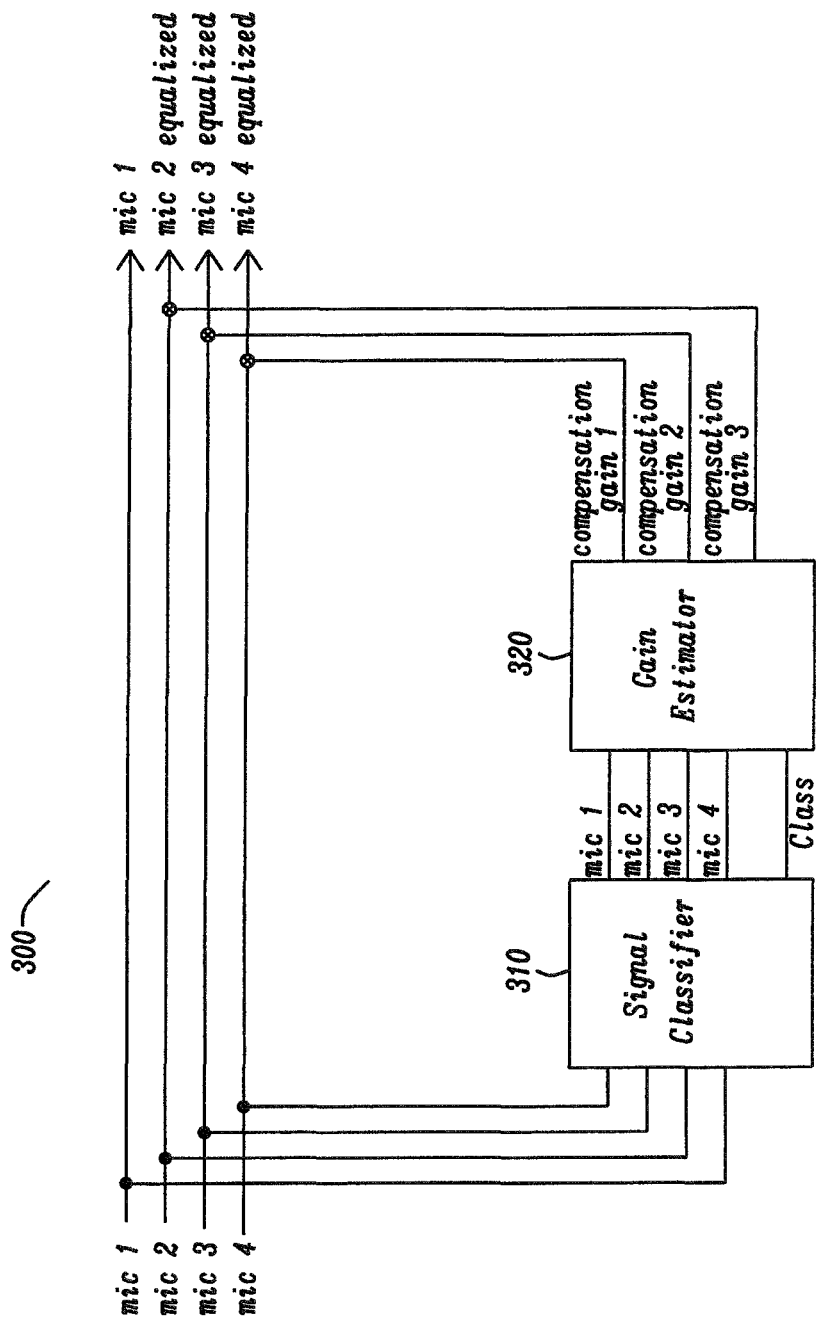
FIG. 3 is a block diagram showing a microphone sensitivity equalization module, comprised of a signal classifier block and a gain estimator block, embodying the principles of the disclosure.

FIG. 3 is a block diagram showing microphone sensitivity equalization module 300, comprised of signal classifier 310 and gain estimator block 320, and a 4-microphone instantiation of the disclosure. There are two stages. The first stage receives input signals from four microphones, mic1, mic2, mic3, and mic4, and classifies the captured content of the audio frame as coherent or diffuse, in signal classifier 310. The microphone separation is known, and is used to improve performance of the signal classifier. The second stage receives the outputs of signal classifier 310, and estimates the logarithmic ratio of the RMS powers of each of the signals to that of the reference signal mid, in gain estimator 320. If the signal classifier has flagged the frame as being diffuse, then it is safe to update it for compensation gain1, compensation gain2, and compensation gain3, respectively.

If the classifier doesn't flag the frame as diffuse, when the signal is coherent, the ratio estimates are not updated. In an ideal system, the ratio will be 1 for all microphone pairs. However, for mismatched microphones, the ratio is smoothed over time to give a direct estimate of the gain required to equalize the RMS powers. The ratio estimates are then applied as gains to the original microphone signals, in mic2 equalized, mic3 equalized, and mic4 equalized of microphone sensitivity equalization module 300. The module requires 2 or more microphone inputs, compensating for sensitivity differences between the devices.

Magnitude Squared Coherence (MSC) is a statistic that is used to examine the relation between two audio signals and is defined as Cxy(f) for a frequency f. Pxy(f) is the cross spectral density of two microphone input signals x(t) and y(t), and Pxx(f) and Pyy(f) are the auto-spectral densities of x(t) and y(t) respectively. The coherence function estimates the extent to which y(t) may be predicted from x(t) by an optimum linear least squares function:

$$C_{xy}(f) = \frac{|P_{xy}(f)|^2}{P_{xx}(f)P_{yy}(f)}$$

Figure 4:
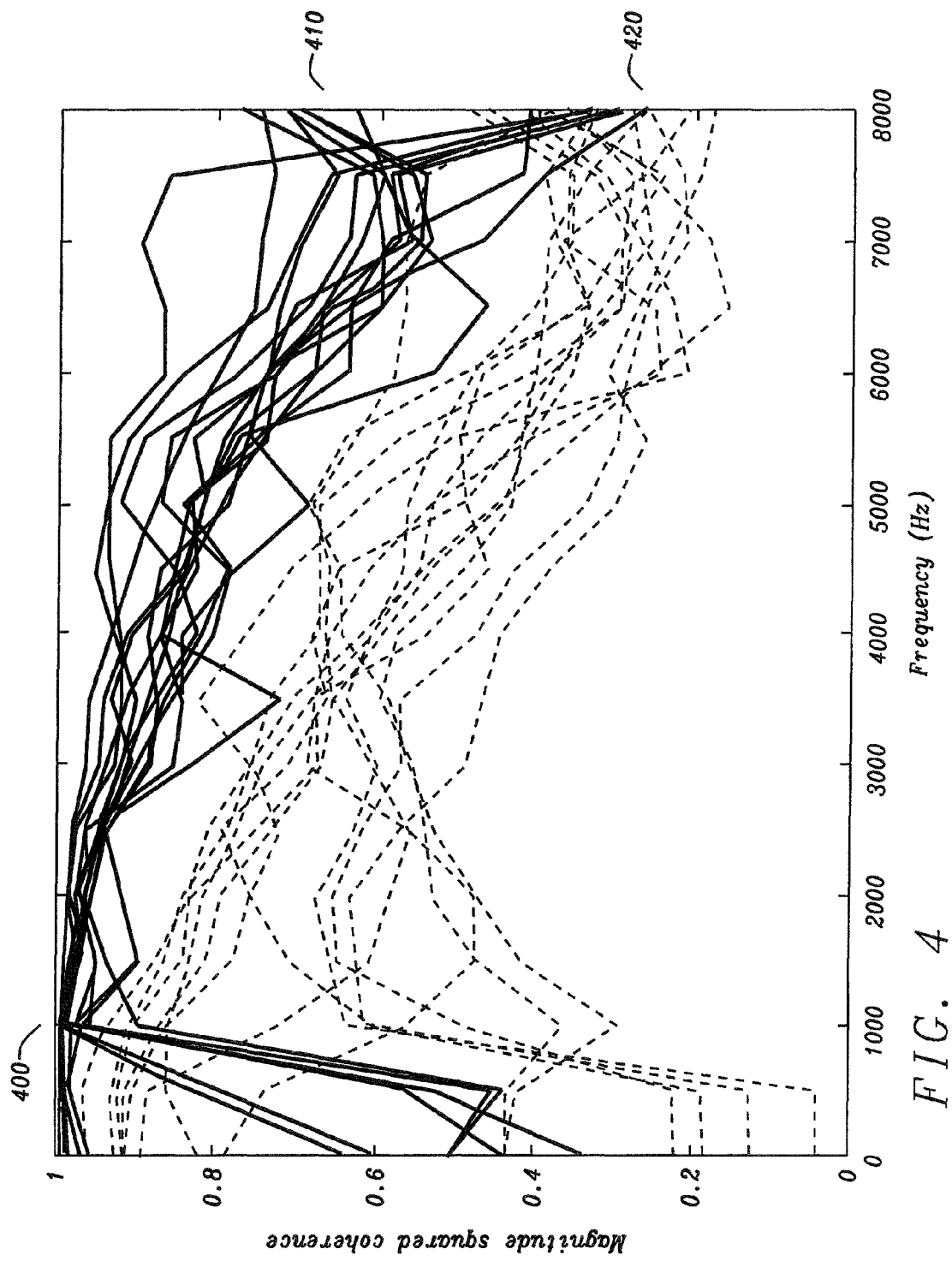
FIG. 4 illustrates Magnitude Squared Coherence for speech and non-speech audio for different frequencies, embodying the principles of the disclosure.

FIG. 4 illustrates Magnitude Squared Coherence 400 for speech and non-speech audio for different frequencies, embodying the principles of the disclosure. In order to determine if a set of input signals is the result of a diffuse noise field, the disclosure makes use of the MSC measure between two microphone inputs. As shown, it is possible to distinguish a difference in the MSC values, depending on whether the input is from coherent (speech) 410 or diffuse (non-speech) 420 audio fields. This forms the basis for Signal Classifier 310, which calculates the MSC on a block-by-block basis, labeling/flagging each block as coherent or diffuse.

The classifier of the disclosure is able to discriminate between coherent or diffuse frames of audio, and this is achieved using a binary classifier with a Generalized Linear Model (GLM). The GLM provides a flexible generalization of an ordinary linear regression, and is used with a measure on the audio signals, to allow for two target classes to be linearly separable, and error types tuned. The classifier handles different input sampling frequencies and block sizes, and the classification measure is carefully constructed, to be flexible enough to be tunable for all cases.

The GLM method of the disclosure calculates a score from the weighted sum of the set of observed variables, here the individual MSC bins. This score is then combined with a bias term, or threshold, to make the final decision if the audio frame is diffuse or coherent. This is shown is Equation 1a, where y(x,w) is the calculated score. The sum is over N MSC bins, which are represented by $x_i$, and $w_i$ represents the bin weights, and $w_T$ represents the bias term. The classification decision d(u) is then given in Equation 1 b.

$$y(x, w) = \sum_{i=1}^{N} w_i x_i + w_T \tag{1a}$$

$$d(u) = \begin{cases} 1 : x \geq 0 \\ 0 : x < 0 \end{cases} \tag{1b}$$

Figure 5:
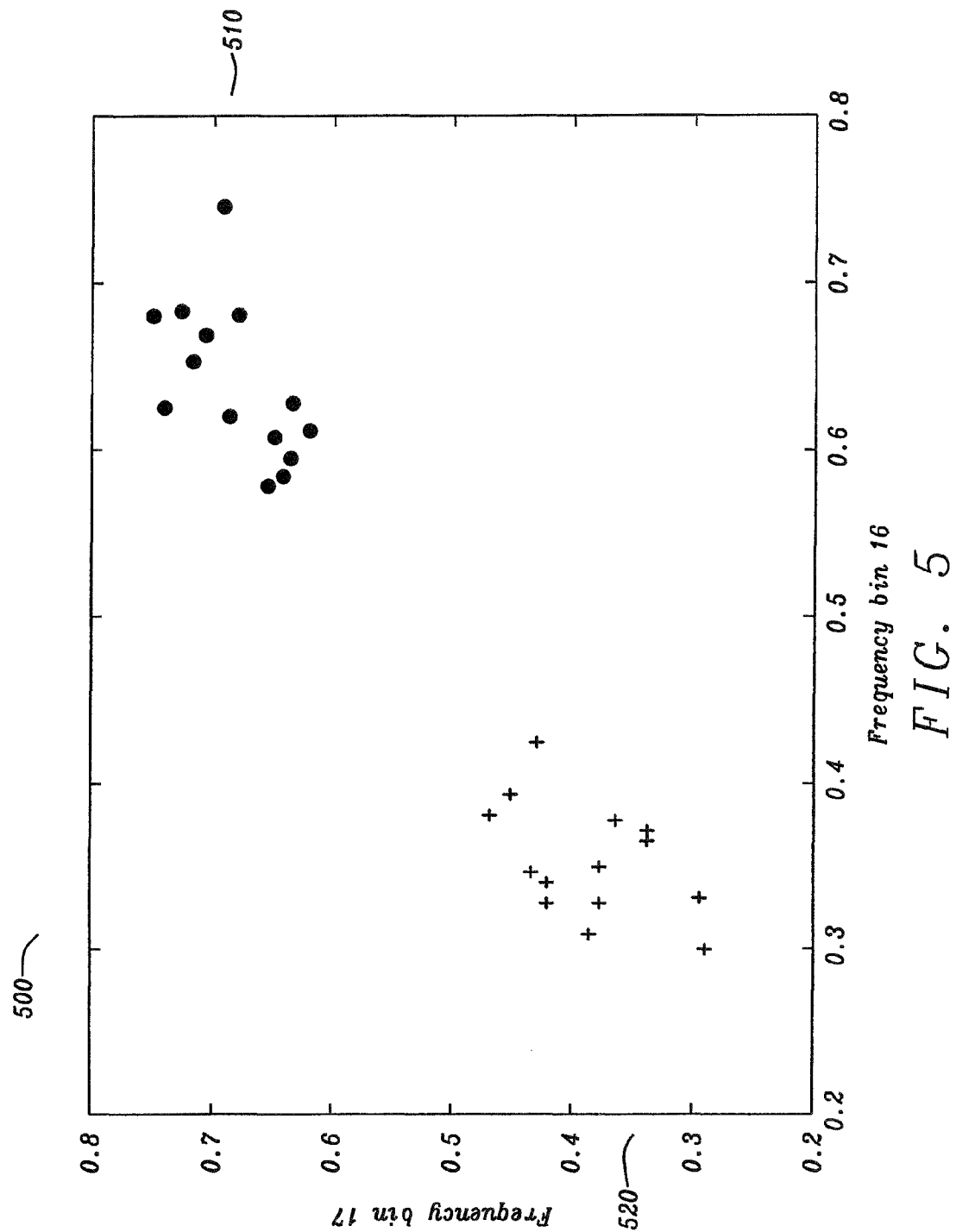
FIG. 5 shows linearly separable Magnitude Squared Coherence bins for speech and non-speech audio for different frequencies, embodying the principles of the disclosure.

FIG. 5 shows linearly separable Magnitude Squared Coherence bins 500 for speech 510 and non-speech 520, for different frequencies, embodying the principles of the disclosure. The use of this model assumes the data being classified is linearly separable, and that a line (or more generally, a hyperplane) may be used to separate the data into different classes. A 2-dimensional example is illustrated, where the data from two MSC bins are in two clusters and may be separated, coherent 510 from diffuse 520, using a straight line.

In the Generalized Linear Model of the disclosed classifier, weights are chosen to ensure that separation occurs correctly. The weight calculation may be performed using logistic regression, and a set of hand labeled training data used to train a set of weights, which separate the data.

Figure 6:
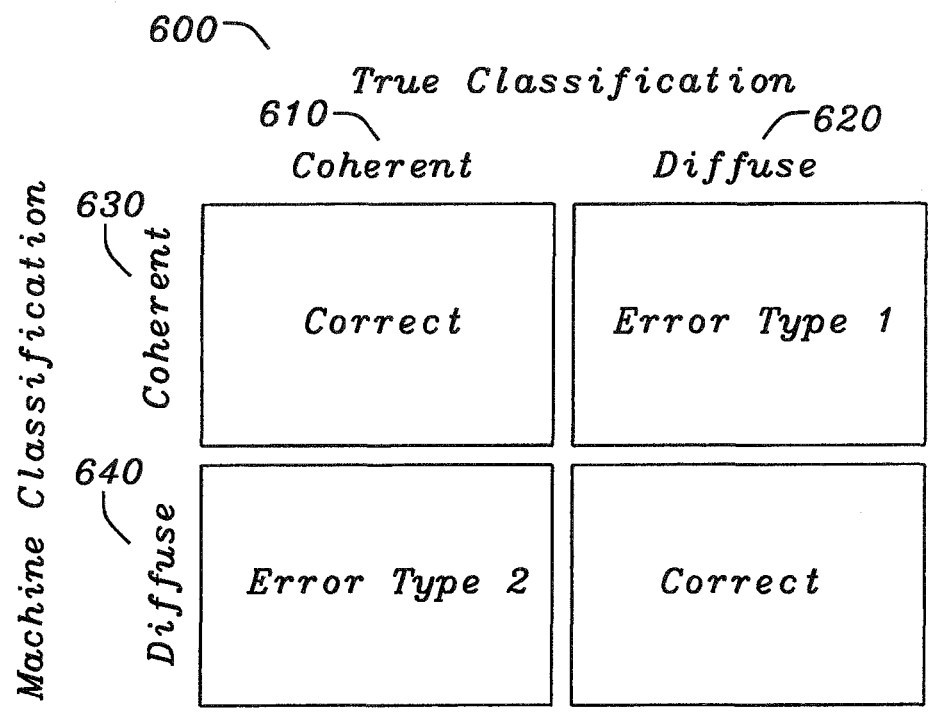
FIG. 6 illustrates Machine Classifier Output States, with two types of errors in the binary class case, embodying the principles of the disclosure.

FIG. 6 illustrates Machine Classifier Output States 600, with two types of errors, in the binary class case, embodying the principles of the disclosure. The machine classifier will not classify perfectly and, in the binary class case, two types of errors are possible. Error Type 1 is when the true classification for the audio signal is diffuse (non-speech) 620 and the machine classification is coherent (speech) 630. Error Type 2 is when the true classification for the audio signal is coherent (speech) 610 and the machine classification is diffuse (non-speech) 640.

Figure 7:
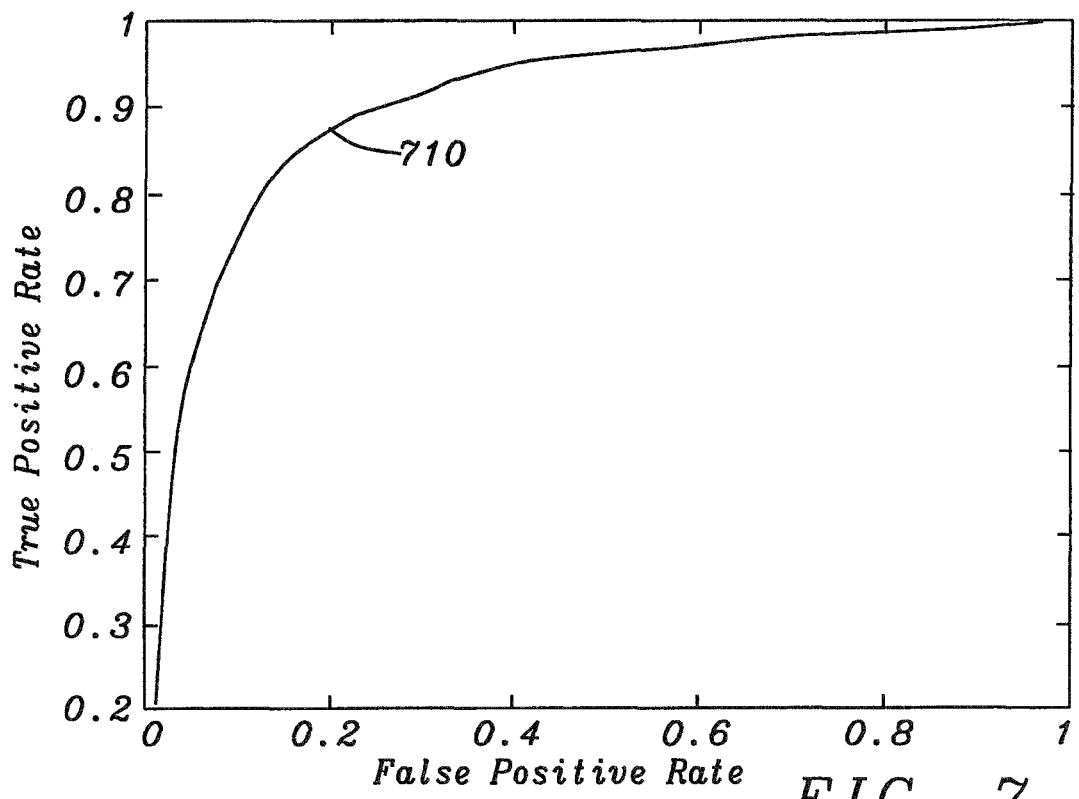
FIG. 7 shows a Receiver Operating Characteristic curve, produced using training data when two microphones are compared while estimating the compensation gain, embodying the principles of the disclosure.

The classifier bias term, or threshold, to make the final decision if the audio frame is coherent or diffuse, may be changed to favor one type of error over the other. This relationship is expressed in the form of a Receiver Operating Characteristic (ROC) curve. FIG. 7 shows Receiver Operating Characteristic (ROC) curve 700, produced using training data when two microphones are compared while estimating the compensation gain, embodying the principles of the disclosure. Modifying the classifier bias term changes the location at which the classifier operates on ROC curve 710.

The Signal Classifier of the disclosure is implemented as a block processing function, which calculates the Power Spectral Density (PSD) estimates in an audio block, the number of which is limited by the size of the Fast Fourier Transform (FFT). The PSD of the signal classifier describes the variance of the signal with frequency, and the FFT converts it from its original time domain to frequency domain. The spectral density characterizes the frequency content of the signal to detect any periodicities in the data. These PSD estimates are calculated for two auto-spectral densities and one cross-spectral density. Each of these is compounded using Welch's method, estimating the signals at different frequencies for the three densities combined.

The next step in the classification of the Signal Classifier is to reset the PSD bins. Note there is an additional filtering step applied to the MSC bins before the classification is applied. The MSC bins are each passed through a leaky integrator, a first order low pass filter with cutoff frequency below the frequency of interest, in an effort to remove some noise observed by a sequence of MSC estimates. The algorithm makes use of Welch's overlapped averaged periodogram, converting the signals from the time domain to frequency domain, to estimate the spectral densities.

The Signal Mismatch Estimator/Compensator of the present disclosure is a signal-processing block, which calculates the microphone mismatch and applies gain compensation. The compensator applies the gains calculated by the signal mismatch estimator to the microphone inputs, resulting in a scaled output equivalent to using an array of matched microphones. The disclosure uses a statistical estimation approach, here a simplified Kalman Filter, to calculate the microphone mismatch. The Kalman Filter algorithm uses a series of measurements observed over time, to produce estimates that tend to be more precise than those based on a single measurement alone. Each audio frame, and the metrics derived from thereof, is treated as a noisy observation of the true relationship between signal levels from different transducers. This allows the required gains to be calculated using statistical methods. It is assumed that phase mismatch between microphones is either negligible or insignificant.

The gain estimation of the signal mismatch is based on the logarithmic ratio of the root mean square (RMS) powers of the microphone signals. Updates to the estimates are made in blocks labeled by the signal classifier as diffuse, therefore any difference in the RMS power between signals is assumed to be caused by transducer sensitivity mismatch. The ratio of the RMS powers in the disclosure corresponds exactly to the required gain. Therefore, the calculation of the RMS ratio leads directly to a noisy observation of the required gain, which may be statistically filtered to estimate the underlying true RMS ratio between microphone signals.

The incoming audio signal may be high-pass filtered to remove noise induced by mechanical vibrations. The RMS power for each microphone is then calculated, and the microphone ratio calculated. The Kalman Filter scheme is theoretically a minimum mean squared-error (MMSE) unbiased estimator of the audio noise value. The filter of the disclosure must be supplied with estimates of the observation noise covariance and the process noise covariance, as well as state and observation translation matrices. Variables for the Kalman filter state update rules are:

A is the state transition matrix;
y[n−1] is the output vector at the previous time step;
B and u[n] are control parameters, which are unused and ignored in this application;
P[n] is the estimation error covariance matrix at step n;
Q is the estimate of the process noise covariance;
K is the optimal Kalman gain and is a function of the relative certainty of the measurements and current state estimate;
R is the estimate of the observation noise covariance;
H is the observation translation matrix;
I is the identity matrix; and
z[n] is the vector of observations at step n.

As the microphone ratio for each pair is assumed to be independent, the Kalman filter of the disclosure is applied using scalar quantities, not vectors.

$$\hat{y}[n] = Ay[n-1] + Bu[n] \tag{a}$$

$$\hat{P}[n] = AP[n-1]A^T + Q \tag{b}$$

$$K = \hat{P}[n]H^T(H\hat{P}[n]H^T + R)^{-1} \tag{c}$$

$$y[n] = \hat{y}[n] + K(z[n] - H\hat{y}[n]) \tag{d}$$

$$P[n] = (I - KH)\hat{P}[n] \tag{e}$$

The observation noise covariance is estimated from recorded data, where the logarithmic ratios are estimated. The variance of these ratio estimates is then used itself as an estimate of the observation noise covariance. Note that in general, the problem of estimating noise covariance for Kalman filters is not trivial and it is assumed that the microphone sensitivities do not change significantly over time. These sensitivities are modeled as having an identity state transition matrix, A=I, and allow them to change only very slowly under process noise. As such, the Kalman filter of the disclosure is provided with a very low process noise covariance, allowing most of the system noise to be attributed to the observation noise.

The Kalman filter of the disclosure, used for ratio tracking, becomes computationally simpler than suggested by the equations, as scalars are used to filter each pair individually, instead of vectors. Further, A=1, B & u[n] are unused, and H=1, as the observations z[n] for each microphone pair are direct observations of the ratios.

Figure 8:
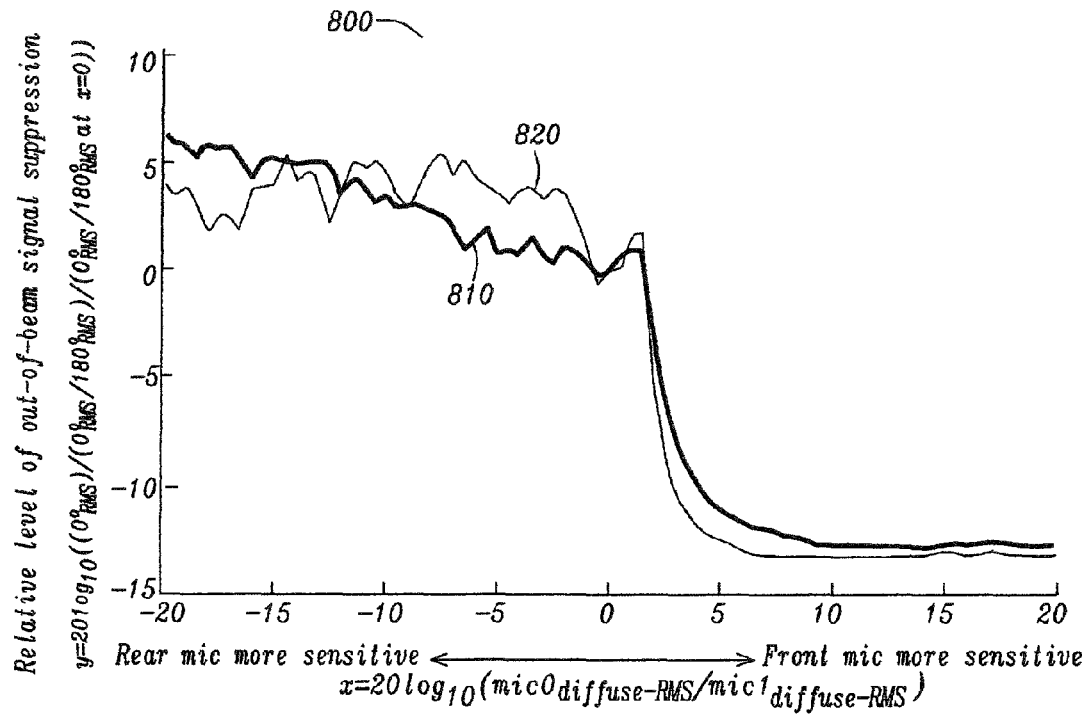
FIG. 8 illustrates the effect on the beamformer output performance when the relative sensitivities of a pair of microphones are changed, embodying the principles of the disclosure.

FIG. 8 illustrates the effect on the beamformer output performance 800 when the relative sensitivities of a pair of microphones are changed, embodying the principles of the disclosure. The relative level of out-of-beam signal suppression is measured along the y-axis, and the microphone sensitivity is measured along the x-axis, where 0 dB indicates equal sensitivities. Two sets of data are shown, for microphone set 1, recording 1 810, and for microphone set 1, recording 2 820. The disclosure ensures the sensitivities are equalized, so that the level of out-of-beam signal suppression is maximized and the resulting system improves beamformer response by up to 15 dB. A biasing term may be added to the calculated gain of the disclosure, to ensure continued operation on the left hand side of the graph, when the calculated gain estimate is noisy. Note that a simple fixed gain of large enough magnitude (determined by the combined microphone sensitivity tolerances specified by the manufacturer) applied to one of the microphones would be enough to guarantee operation on the left hand side of the curve. However, significant audio quality loss may be encountered when this technique is applied and the resulting operating position far to the left of 0 dB. The ideal operating position for the example system is as close to 0 dB sensitivity mismatch as possible. To allow for noise on the calculated gain, a small bias is added to the calculated gain, such that given the experimentally observed variance of the gain estimate, the noise pushes the system into operating to the right of the indicated steep drop in performance, with low probability, in the present disclosure. Note that the signal ratios between microphones are tracked and manipulated using logarithms. This is necessary to provide a Gaussian distribution, which is a requirement of the Kalman filter.

Figure 9:
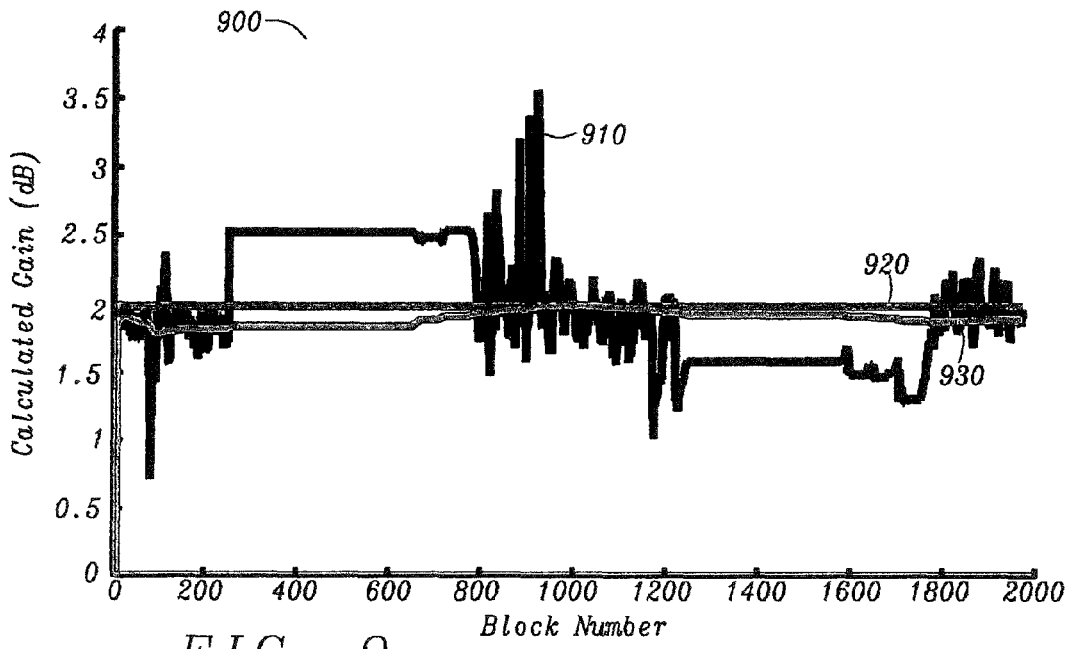
FIG. 9 shows the response of an example implementation over time, where incoming audio is split into blocks, illustrating the extracted compensation gain for a mismatched microphone pair, embodying the principles of the disclosure.

FIG. 9 shows the response of an example implementation over time 900, where incoming audio is split into blocks, illustrating the extracted compensation gain for a mismatched microphone pair, embodying the principles of the disclosure. An initial hand-made compensation gain estimate is included for reference in 920, and the microphone 2 gain, as calculated by the implementation of the disclosure, is shown in 930. The observed signal ratios of microphone 1 to microphone 2 are illustrated in 910. The blocks corresponding to a coherent sound field, such as speech, are identified as the flat sections of 910. This is where the signal classifier has flagged that the gain estimator should not update the gain estimate for microphone 2.

Figure 10:
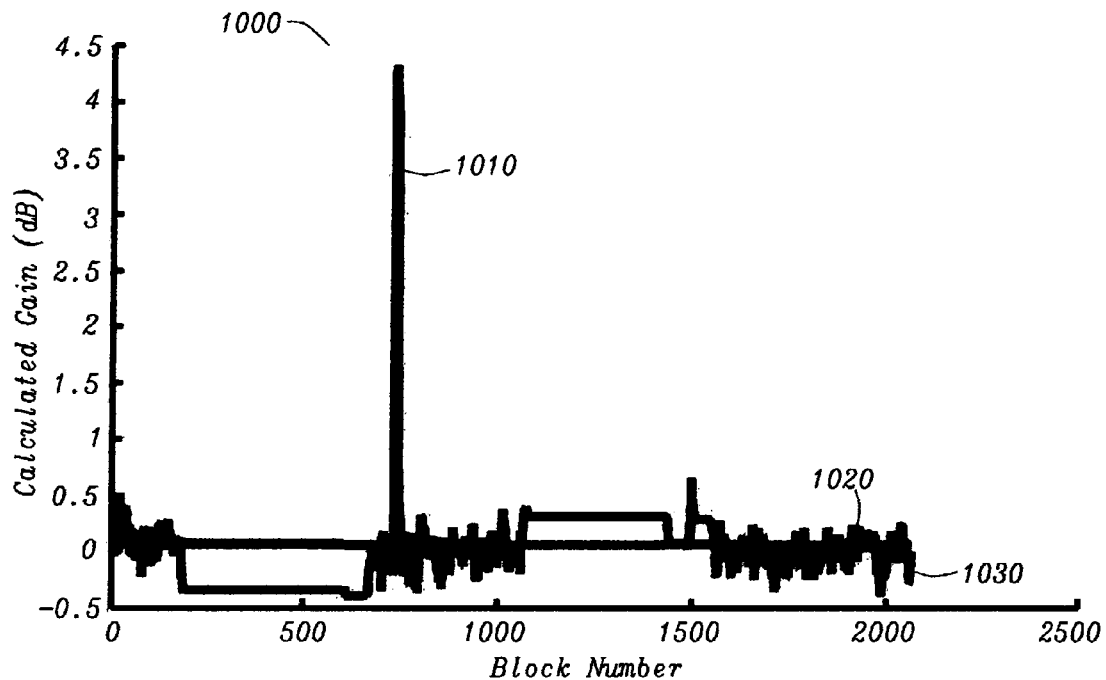
FIG. 10 shows the process run on a pair of microphones already well matched, illustrating the extracted compensation gain for a matched microphone pair, to aid in the detection of the principles of the disclosure.

FIG. 10 shows the same process when run on a pair of microphones already well matched, illustrating the extracted compensation gain for a matched microphone pair, embodying the principles of the disclosure. The transducer sensitivities are approximately the same and no correction is required. The module successfully extracts a 0 dB gain which, when applied to the microphone channels, has no detrimental effect. The observed microphone signal ratios of microphone 1 to microphone 2 are indicated in 1010, the initial hand-made gain estimate for reference is shown in 1020, and the compensation gain for microphone 2, as calculated by the implementation of the disclosure, is indicated in 1030.

Figure 11:
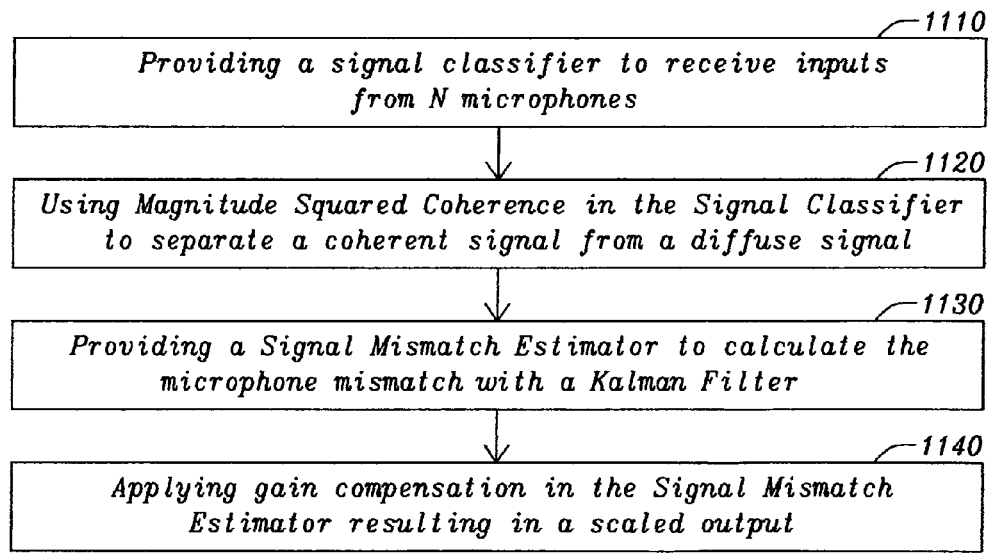
FIG. 11 is a flow chart of a method for microphone runtime compensation, providing for the difference in sensitivity to sound pressure level between transducer elements, with an array of 2 or more microphones configured, embodying the principles of the disclosure.

FIG. 11 is a flow chart 1100 of a method for microphone runtime compensation, providing a Signal Classifier, to receive inputs from N microphones, in 1110, and using Magnitude Squared Coherence in the Signal Classifier to separate a coherent signal from a diffuse signal, in 1120. A Signal Mismatch Estimator is provided, to calculate the microphone mismatch, with a Kalman Filter in 1130. Gain compensation is applied, in the Signal Mismatch Estimator, resulting in a scaled output, in 1140.

The present disclosure has been implemented on a single cycle Multiplier-Accumulator (MAC) Digital Signal Processor (DSP) in approximately 5 Megahertz (MCPS) for 4×16 KHz audio channels/microphone inputs.

The proposed solution has been tailored for speech, and it may indeed be useful in other areas of beamforming, acoustically and at radio frequency. Underwater sonar systems may also benefit if the ambient background is sufficiently diffused.

The advantages of one or more embodiments of the present disclosure includes the elimination of the need for a costly per-device calibration step, and allows a manufacturer to use lower-specced, and therefore cheaper, transducers than might have been otherwise used. The disclosure is easily scalable from two microphones to larger arrays, with no inherent upper limit, and may manage a broad range of microphone sensitivity mismatches. The present disclosure may be implemented with a small memory footprint, has been shown to be robust in a broad range of signal types and signal-to-noise ratios, and provides the ability to detect if a microphone is outside it's manufacturing tolerance or failed completely. The combination of a low complexity Signal Classifier and Signal Mismatch Estimator/Compensator results in low overall system complexity.

While this invention has been particularly shown and described with reference to the preferred embodiments thereof, it will be understood by those skilled in the art that various changes in form and details may be made without departing from the spirit and scope of the invention.

The invention claimed is:

1. A system for equalization of microphone sensitivities, comprising:
a Signal Classifier configured to receive a set of inputs from N microphones to determine when a noise field is diffuse;
said Signal Classifier configured to use Magnitude Squared Coherence to separate a coherent signal from a diffuse signal; and
a Signal Mismatch Estimator/Compensator configured to calculate a microphone mismatch and to apply a gain compensation to each of said microphone inputs;
said Signal Mismatch Estimator/Compensator configured to use a Kalman Filter to calculate said microphone mismatch;
said Signal Mismatch Estimator/Compensator configured for gain compensation, resulting in a scaled output equivalent to using an array of matched microphones.

2. The system for equalization of microphone sensitivities of claim 1, wherein said Signal Classifier is configured to receive said signals of different sampling frequencies and block sizes.

3. The system for equalization of microphone sensitivities of claim 1, wherein said Magnitude Squared Coherence is configured between two microphone inputs and flags said signal as coherent or diffuse on a block by block basis.

4. The system for equalization of microphone sensitivities of claim 1, wherein said Signal Classifier is configured using a Generalized Linear Model to calculate a weighted sum of observed Magnitude Squared Coherence bins, to linearly separate said Magnitude Squared Coherence bins, using a logistic regression and training data.

5. The system for equalization of microphone sensitivities of claim 1, wherein said Signal Classifier is configured using a Generalized Linear Model with a bias term, said bias term set to favor one of two types of classification errors, true positive or false positive type.

6. The system for equalization of microphone sensitivities of claim 1, wherein said Magnitude Squared Coherence of said Signal Classifier is configured to pass said Magnitude Squared Coherence bins through a low pass filter to remove noise observed by the classification.

7. The system for equalization of microphone sensitivities of claim 1, wherein said Signal Mismatch Estimator/Compensator is configured for gain based on an independent logarithmic ratios of root mean square powers of said microphone inputs.

8. The system for equalization of microphone sensitivities of claim 1, wherein said Kalman Filter is configured with an observation noise covariance and a process noise covariance from recorded.

9. The system for equalization of microphone sensitivities of claim 1, wherein said Kalman Filter is configured to statistically filter a logarithmic ratio of said root mean square powers of said microphone inputs, and the difference between said root mean square powers is determined to be a microphone sensitivity mismatch.

10. A method for implementing a system for equalization of microphone sensitivities, comprising the steps of:
    providing a Signal Classifier to receive inputs from N microphones;
    using Magnitude Squared Coherence in the Signal Classifier to separate a coherent signal from a diffuse signal;
    providing a Signal Mismatch Estimator to calculate a microphone mismatch with a Kalman Filter for each of said N microphones; and
    applying gain compensation in the Signal Mismatch Estimator to each of said N microphones, resulting in a scaled output.

11. A method for implementing a system for equalization of microphone sensitivities of claim 10, wherein a Signal Classifier receives said signals of different sampling frequencies and block sizes.

12. A method for implementing a system for equalization of microphone sensitivities of claim 10, wherein Magnitude Squared Coherence flags said signal as coherent or diffuse on a block-by-block basis.

13. A method for implementing a system for equalization of microphone sensitivities of claim 10, wherein said Signal Classifier calculates a weighted sum of observed Magnitude Squared Coherence bins, linearly separates said bins using a logistic regression, training data, and a Generalized Linear Model.

14. A method for implementing a system for equalization of microphone sensitivities of claim 10, wherein said Generalized Linear Model makes use of a bias term, said bias term set to favor one of two types of classification errors, true positive or false positive type.

15. A method for implementing a system for equalization of microphone sensitivities of claim 10, wherein said Magnitude Squared Coherence of said Signal Classifier passes said Magnitude Squared Coherence bins through a low pass filter to remove noise observed by the classification.

16. A method for implementing a system for equalization of microphone sensitivities of claim 10, wherein a Signal Mismatch Estimator/Compensator determines gain based on an independent logarithmic ratios of root mean square powers of said microphone inputs.

17. A method for implementing a system for equalization of microphone sensitivities of claim 10, wherein a Kalman Filter employs the observation noise covariance and a process noise covariance from recorded data.

18. A method for implementing a system for equalization of microphone sensitivities of claim 10, wherein said Kalman Filter statistically filters a logarithmic ratio of said root mean square powers of said microphone inputs, and a set of differences between said root mean square powers determines a microphone sensitivity mismatch.

* * * * *